United States Patent

Fontana et al.

[11] Patent Number: 5,959,902
[45] Date of Patent: Sep. 28, 1999

[54] VOLTAGE LEVEL SHIFTER DEVICE, PARTICULARY FOR A NONVOLATILE MEMORY

[75] Inventors: Marco Fontana, Milan; Antonio Barcella, Trescore Balneario, both of Italy

[73] Assignee: STMicroelectronics S.r.l., Agrate Brianza, Italy

[21] Appl. No.: 09/030,604

[22] Filed: Feb. 25, 1998

[30] Foreign Application Priority Data

Feb. 28, 1997 [EP] European Pat. Off. .............. 97830085

[51] Int. Cl.$^6$ ...................................................... G11C 7/00
[52] U.S. Cl. ........................................................ 365/189.11
[58] Field of Search .......................... 365/189.11, 189.01, 365/210

[56] References Cited

U.S. PATENT DOCUMENTS 5,365,479  11/1994  Hoang et al. ...................... 365/189.11
5,708,604  1/1998  Fontana et al. .................... 365/189.11
5,787,037  7/1998  Amanai ............................... 365/185.18

*Primary Examiner*—David Nelms
*Assistant Examiner*—Anh Phung
*Attorney, Agent, or Firm*—David V. Carlson; E. Russell Tarleton; Seed and Berry LLP

[57] ABSTRACT

In a first operation mode the level shifter transmits as output a logic input signal and in a second operation mode it shifts the high logic level of the input signal from a low to a high voltage. The level shifter comprises a CMOS switch and a pull-up transistor; the CMOS switch comprises an NMOS transistor and a PMOS transistor which are connected in parallel between the input and the output of the shifter and have respective control terminals connected to a first supply line at low voltage and, respectively, to a control line connected to ground in the first operation mode and to the high voltage in the second operation mode; the pull-up transistor is connected between the output of the shifter and a second supply line switchable between the low voltage and the high voltage and has a control terminal connected to the first supply line.

16 Claims, 3 Drawing Sheets

VOLTAGE LEVEL SHIFTER DEVICE, PARTICULARY FOR A NONVOLATILE MEMORY

TECHNICAL FIELD

This invention relates to a voltage level shifter device, particularly for a non-volatile memory integrated on a semiconductor. This invention also relates to shifting voltage levels for circuits integrated on a semiconductor.

BACKGROUND OF THE INVENTION

As is known, integrated electronic devices may comprise circuit parts which, although cooperating with each other, operate on different voltage levels and must therefore be supplied with power separately. Furthermore, some of these circuit parts may require different supply voltages according to the operation mode of the device of which they form part.

For example, in non-volatile memory devices (EPROM, EEPROM, flash etc.), to which reference will be made in the rest of the description, the various circuit parts (such as those for decoding, for redundancy, for programming etc.) operate at different voltages according to the operation mode of the device (reading, programming, verifying etc.) and must therefore be connected by means of circuits known as "level shifters".

A block diagram relating to the arrangement of a voltage shifter in a non-volatile memory 10 is shown in FIG. 1, in which the voltage shifter 1, connected to a first supply line 2 at voltage Vpc, is inserted between a first circuit 3 connected to a second supply line 4 placed at the supply voltage Vdd, and a second circuit 5 connected to the first supply line 2. The voltage Vpc alternatively has, according to the operation mode presented (programming, reading, verification, . . . ), the value of the supply voltage Vdd or a voltage Vpp (typically, the programming voltage) greater than Vdd. For this purpose, the first supply line 2 is connected, by means of a controlled switch 7, to the second supply line 4 or to a supply line 6 at Vpp, where the voltage Vpp may be tapped from a suitable pin or generated internally in the device with suitable charge pumps.

In a first operation mode in which the voltage Vpc is equal to the supply voltage Vdd, the shifter 1 is not required to make any level shift but solely to reproduce the input signal correctly, with minimum delay and consumption, vice-versa, in a second operation mode, in which the voltage Vpc is equal to the voltage Vpp, the shifter 1 has to generate at the output a signal whose lowest logic state is close to the reference potential of the circuit (ground) and the highest logic state is close to the voltage Vpp.

FIG. 2 shows an embodiment of a level shifter 1' of known type, having an input 9, on which it receives an input signal Si from the circuit 3 operating at the voltage Vdd, and an output 12, on which it supplies a signal So to the circuit 5 connected to the first supply line 2.

The level shifter 1' comprises an NMOS pass transistor 15 having a first terminal connected to the input 9, a second terminal connected to an intermediate node 16 and a gate terminal connected to the second supply line 4 at voltage Vdd; an inverter 17, having N input connected to the intermediate node 16, AN output connected to the output 12 and supplied at the voltage Vpc; and a pull-up transistor 19 having a gate terminal connected to the output 12, a source terminal connected to the first supply line 2 and a drain terminal connected to the intermediate node 16.

In the level shifter 1', in the first operation mode (reading, verification, . . . ), the voltage Vpc on the first supply line 2 is equal to Vdd. If the logic state of the signal Si presented at the input 9 is low, the NMOS transistor 15 is on and transmits the low logic state onto the node 16. Consequently, the inverter 17 outputs the signal So of high logic state, equal to Vpc. This signal, also presented on the gate terminal of the pull-up transistor 19, keeps the latter off When, however, the logic state of the signal Si is high, the NMOS transistor 15 operates like a diode as it has two terminals placed at the same voltage, it thus determines a voltage drop between the input 9 and the intermediate node 16 which is equal to its threshold voltage Vth. If the supply voltage Vdd is of high value, this voltage drop does not involve problems, and the inverter 17 carries the output signal So at low logic level. In this situation, the pull-up transistor 19 is on, stabilizing a voltage on the intermediate node 16 on the value Vpc. Vice-versa, if the supply voltage Vdd is low (2.7 V for example) this voltage drop may cause problems of functionality and of speed.

In the second operation mode (voltage Vpp on the first supply line 2), the operation of the shifter is similar to that described above. In this mode there also may be problems of functionality and speed, even in a situation of standard level of supply voltage, whenever the difference between the supply voltage Vdd and the threshold voltage Vth is low, such as not to permit the triggering of the inverter 17.

Another known embodiment of the level shifter is shown in FIG. 3, in which the shifter, denoted by 1", comprises two PMOS transistors 26, 27, two NMOS transistors 28, 29 and an inverter 30; the PMOS transistor 26 has a source terminal connected to the supply line 2 at voltage Vpc, a gate terminal connected to the output 12 and a drain terminal connected to a node 32; the NMOS transistor 28 has a drain terminal connected to the node 32, a gate terminal connected to the input 9 and a source terminal connected to ground; the PMOS transistor 27 has a source terminal connected to the first supply line 2, a gate terminal connected to the node 32 and a drain terminal connected to the output 12; the NMOS transistor 29 has a source terminal connected to ground, a drain terminal connected to the output 12, and a gate terminal connected to the output of the inverter 30; the inverter 30 is connected to the second supply line 4 at voltage Vdd and has the input connected to the input 9. Both PMOS transistors 26 and 27 have the substrate connected to the source terminal.

In both modes of operation, when the level of the signal Si is high, the NMOS transistor 28 is on and on the node 32 the signal is low. Consequently, the PMOS transistor 27 is on and the signal So is high and of value equal to Vdd in the first operation mode and Vpp in the second operation mode.

Vice-versa, if the signal Si is low, the NMOS transistor 28 is off, whilst the NMOS transistor 29 is on and the output signal So is low.

In practice, the level shifter 1" functions correctly in both modes of operation, but it has low switching speed and large size, because of the large number of transistors and the complexity of the connections. This size is particularly disadvantageous when the levels of large data or address buses have to be "shifted", for which reason the solution of FIG. 3 is difficult to apply in this case.

SUMMARY OF THE INVENTION

An object of the invention is to provide a voltage level shifter which does not have the disadvantages encountered in the known Solutions.

This invention provides a voltage level shifter device, particularly for non-volatile memories.

The present invention comprises a first and a second switch circuit. The first switch circuit has a first and a second input line and an output wherein the output has a potential switchable between the first and the second input lines. The first input line has a first potential value and the second input line has a potential switchable between a second and a third potential value.

The second switch circuit has a signal input, a potential input and a signal output. The potential input is coupled to the output of the first switch circuit wherein the signal output has a potential equivalent to the first potential value when the signal input has the first potential value, the signal output has a potential equivalent to the third potential value when the potential input has the third potential value and the signal input has the second potential value, and the signal output has a potential equivalent to the second potential value when the potential input has the first potential value and the signal input has the second potential value.

The features and advantages of the present invention will be apparent from the following description embodiments thereof, given by way of non-limitative examples with reference to the accompanying drawings.

DETAILED DESCRIPTION OF THE INVENTION

Figure 4:
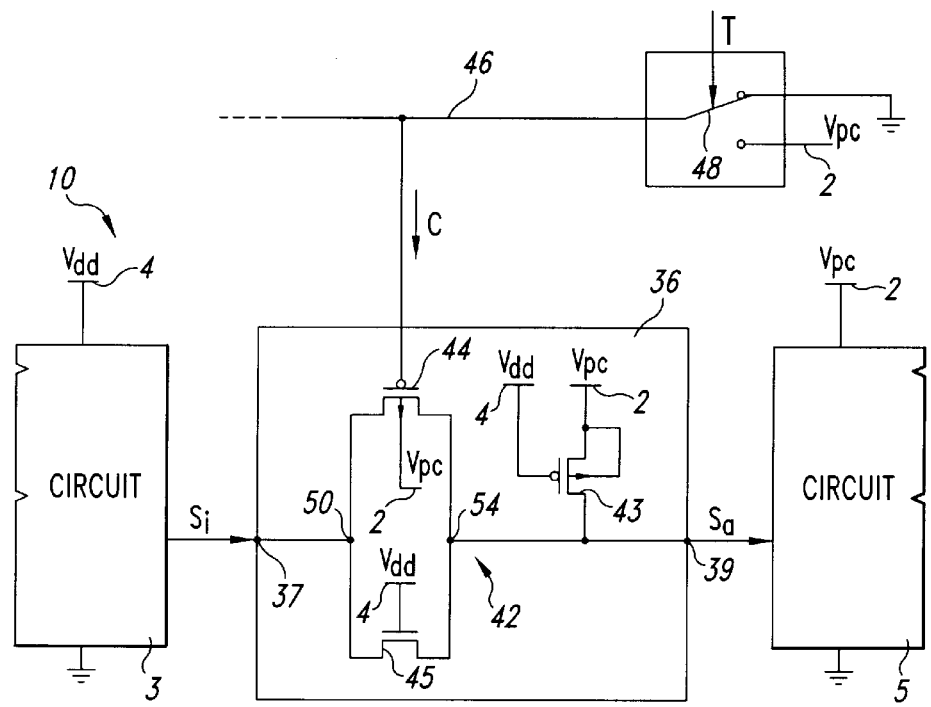
FIG. 4 shows a simplified circuit diagram of a first embodiment of this invention.

A level shifter 36 of FIG. 4 (belonging to the memory 10) has an input 37 at which is presented the signal Si supplied by the circuit 3 operating at the voltage Vdd and an output 39 supplying the signal So to the circuit 5 operating at the voltage Vpc. The shifter 36 comprises a CMOS switch 42 (of the type commonly known as "transmission gate") and a PMOS-type pull-up transistor 43. The CMOS switch 42 is formed by a PMOS transistor 44 and an NMOS transistor 45 having first terminals coupled together at an input node 50 and connected to the input 37, second terminals coupled together at an output node 54 and connected to the output 39 and gate terminals respectively connected to a control line 46 and to the second supply line 4 at voltage Vdd. The substrate of the PMOS transistor 44 is also connected to the first supply line 2 at Vpc. Present on the control line 46 is a control logic signal C, whose value determines a state (on or off) of the PMOS transistor 44. A switch 48, controlled by a signal T, alternatively connects the control line 46 to ground or to the first supply line 2 at voltage Vpc, as described in detail below.

The pull-up transistor 43 has a source terminal connected to the first supply line 2, a drain terminal connected to the output 39 and a gate terminal connected to the supply line 4. Furthermore, the pull-up transistor 43 has substrate connected to the supply line 2, so as to prevent the presence of undesirable direct polarizations between the various regions of the transistor 43. The pull-up transistor 43 is designed in such a way that its internal resistance is much greater than that of the NMOS transistor 45, for the reasons explained below.

The level shifter 36 operates as follows.

The signal T (the programming command signal for example), in the case of the first operation mode at low voltage, has a first logic level such as to electrically connect the control line 46 to ground and, in the case of the second operation mode at high voltage, has a second logic level such as to electrically connect the control line 46 to the supply line 2. In practice, when the switch 48 connects the control line 46 to the supply line 2, the latter has the voltage Vpp and thus the control line 46 is no longer supplied at the voltage Vdd.

In the first operation mode, as indicated above, the control line 46 is connected to ground, for which reason the signal C has low value, whereas the supply line 2 has the voltage Vdd. In these conditions, the pull-up transistor 43 is off, in that the voltage Vdd is present at both the gate terminal and the source terminal. On the other hand the state of the CMOS switch 42 depends on the level of the input signal Si at the node 37, in fact, if the signal Si is of low logic level, the PMOS transistor 44 is off, as its gate and source terminals are at the same voltage, while the NMOS transistor 45 is on and connects the input 37 to the output 39; consequently, the signal So is low.

Vice-versa, if the input signal Si is of high logic level, the NMOS transistor 45 is off as its gate and source terminals are at the same voltage, while the PMOS transistor 44 is on and connects the input 37 to the output 39, consequently, the signal So is high (and of value Vdd equal to that of the input signal Si).

In the second operation mode, the control line 46 is placed at the voltage Vpp. Consequently the PMOS transistor 44 is off, regardless of the level of the input signal Si; at the same time, the pull-up transistor 43 is on, having voltage Vpp at the source terminal and voltage Vdd at the gate terminal. If the signal Si is of low level, the NMOS transistor 45 is on and forms, together with the pull-up transistor 43, a voltage divider between the supply line 2 and the ground, given that the resistance of the pull-up transistor 43 is much greater than that of the NMOS transistor 45, the signal So present at the output 39 is low. This condition does, however, comprise a static consumption of power due to the continuous passage of current from the supply line 2 towards ground, through the NMOS transistor 45 and the PMOS transistor 43.

Vice-versa, if the input signal Si is of high level, the NMOS transistor 45 is off (having voltage Vdd both at the source and at the gate terminal) and the pull-up transistor 43 ensures the presence of a high signal level, of value Vpp, at the output 39.

Figure 5:
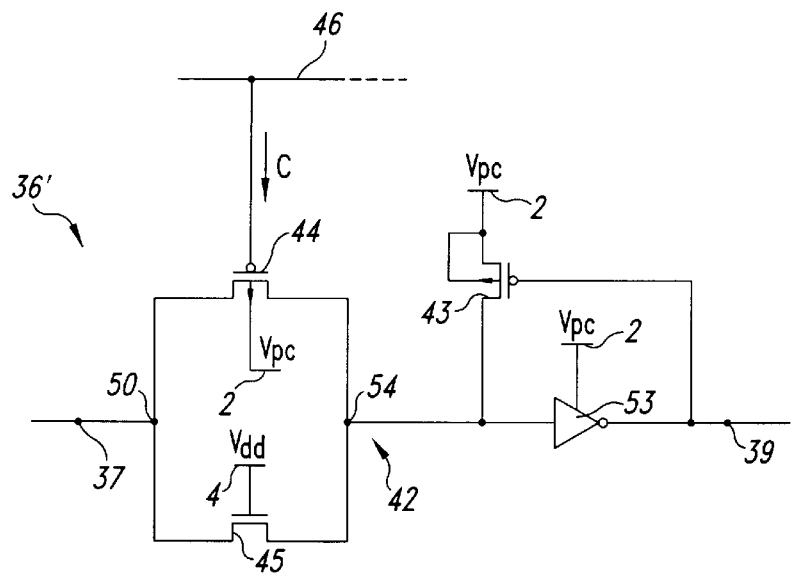
FIG. 5 shows a diagram of a second embodiment of this invention.

FIG. 5 shows a level shifter 36' similar to the level shifter 36 of FIG. 4. The level shifter 36' differs from the shifter 36 by the presence of an inverter 53 between the output node of the CMOS switch 42, denoted by 54, and the output 39, and by the fact that the pull-up transistor 43 has the drain terminal connected to the node 54 and the gate terminal connected to the output 39. The inverter 53 is connected to the supply line 2. In a way not shown, the control line 46 is connected to the switch 48, in a similar way to FIG. 4.

The level shifter 36' operates as follows.

In the first operation mode (control signal C of low logic level and voltage Vdd on the supply line 2), if a signal Si of low logic level is presented on the input node 37, the PMOS transistor 44 is off, whilst the NMOS transistor 45 is on; there is therefore a low logic state at the node 54 and a signal So which is high and of value Vdd at the output from the inverter 53. This signal So also provides to keep the pull-up transistor 43 off.

Vice-versa, if the signal Si is of high logic level on the input node 37, the NMOS transistor 45 is off, whilst the PMOS transistor 44 is on and there is a high logic level on the node 54; there is therefore a signal So of low logic level at the output of the inverter 53. In this situation the pull-up transistor 43 is on, carrying the node 54 to the voltage level Vdd.

In the second operation mode, the control signal C is of high logic level and, consequently, the PMOS transistor 44 is off, regardless of the level of the input signal Si. If the signal Si is low, the NMOS transistor 45 is on and there is a low level on the node 54. At the output of the inverter 53 there is therefore a signal So of high level and of value Vpp (given that the inverter 53 is now supplied at that voltage) and the pull-up transistor 43 is off, having a high voltage at its gate terminal.

If the signal Si is high and there is the switching from the first to the second operation mode, the PMOS transistor 44 is turned off, the NMOS transistor 45 remains off and the pull-up transistor 43 (which is on) carries the node 54 to the high state at Vpp. The output 39 thus remains low. Vice-versa, if the input signal Si switches from the low level to the high level during the second operation mode, the NMOS transistor 45, initially on, transmits the level of the input signal Si to the node 54 until that signal reaches the value Vdd−Vth, where Vth is the threshold voltage of the transistor 45, after which it turns off. The inverter 53 thus receives as input a signal whose maximum value is Vdd−Vth, which may not be sufficient to cause it to switch. If this value is sufficient, at the output of the inverter there is a signal So of low logic value which turns the pull-up transistor 43 on; in this case the latter carries the voltage Vpp on the node 54. If, vice-versa, the value is insufficient, the inverter 53 does not switch and does not permit the pull-up transistor 43 to turn on, so that, when the NMOS transistor 45 is off, the node 54 remains floating and there is no passage of signal towards the output 39.

Consequently, the level shifter 36', although not having static consumption, is not always suitable for being used in applications in which the switching of the input signal Si may take place in conditions of high voltage (Vpc=Vpp). In this case, therefore, it is preferable to use the shifter 36 of FIG. 4. On the other hand, this problem does not exist in the case of use of the shifter 36' in a non-volatile memory, in which the switching of the input signal takes place solely during the first operation mode (Vpc=Vdd) and the input signal is constant during the second operation mode.

Figure 1:
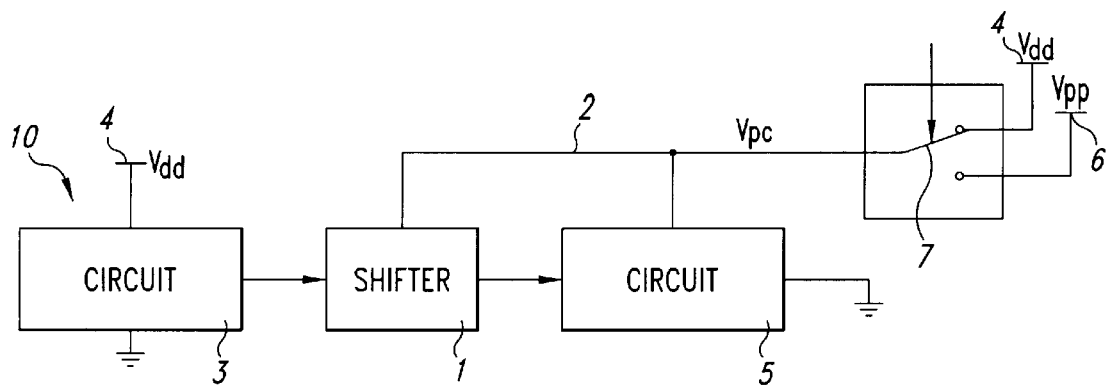
FIG. 1 shows a block diagram of a non-volatile memory comprising a level shifter.
Figure 2:
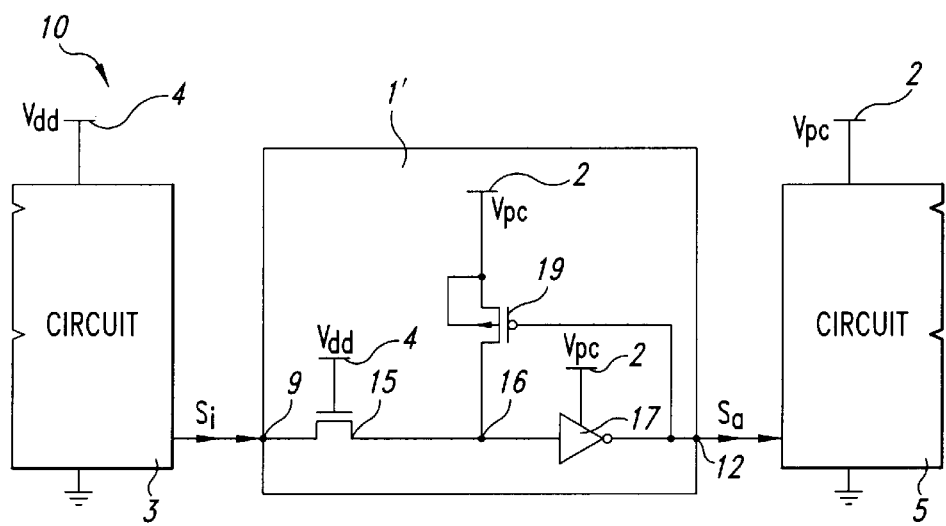
FIG. 2 shows a circuit diagram of a first voltage level shifter of known type.
Figure 3:
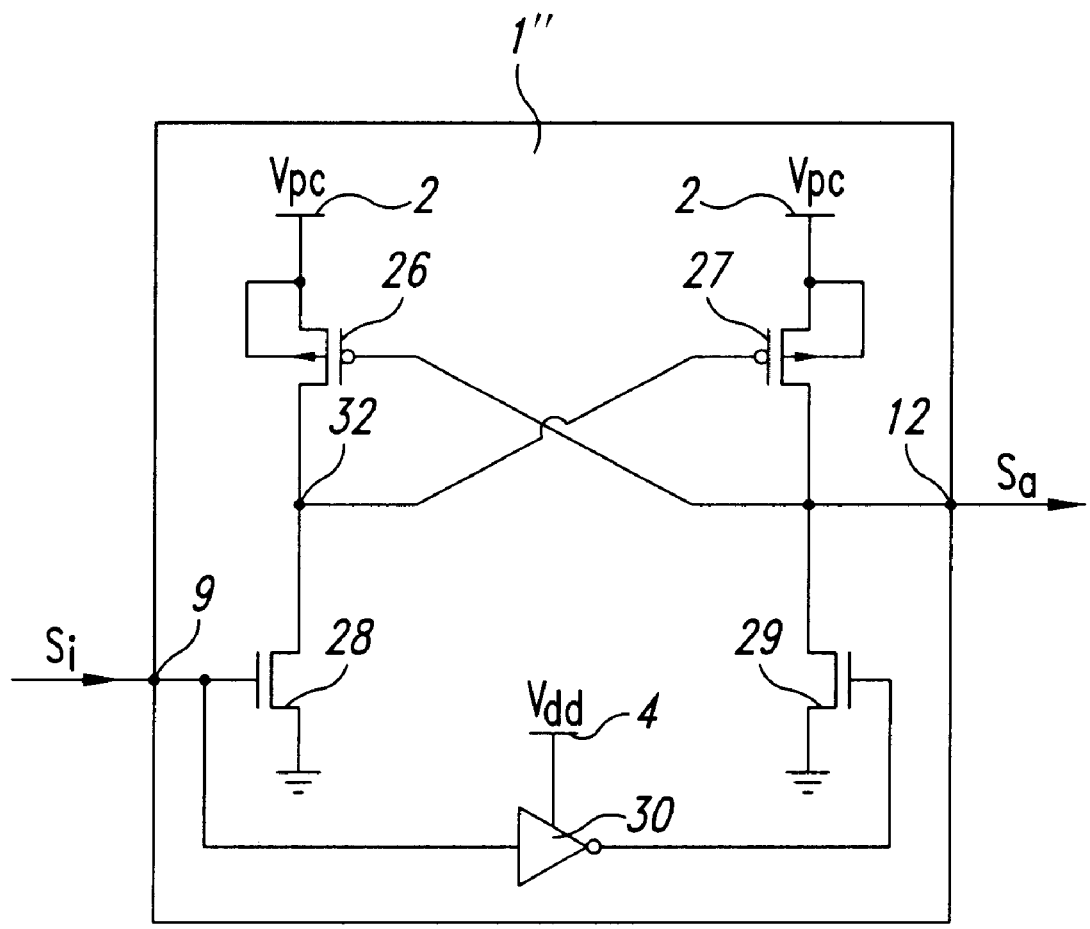
FIG. 3 shows a diagram of a second voltage level shifter of known type.

The level shifters 36 (FIG. 4) and 36' (FIG. 5) offer advantages with respect to both the known solutions described above. In fact, the level shifters 36 and 36' are faster and have better functionality in conditions of low voltage compared with the level shifter 1' (FIG. 2), and are simpler and smaller in size compared with the level shifter 1" (FIG. 3).

Furthermore, it will be clear that modifications and variants may be introduced to the level shifter described and illustrated here without thereby departing from the protective scope of the invention. In particular, in the embodiment of FIG. 4, the ground line may be replaced by a simple connection to the substrate, using the biasing of substrate already present for other components of the circuit (memory), given that it has solely the function of suitably biasing the bulk of the NMOS transistor 45 (in a manner not shown).

From the foregoing it will be appreciated that, although specific embodiments of the invention have been described herein for purposes of illustration, various modifications may be made without deviating from the spirit or scope of the invention. Accordingly, the invention is not limited except as by the appended claims.

We claim:

1. A voltage level shifter device, particularly for non-volatile memories, comprising:

a first line set at a first reference potential;

a second line set at a second reference potential greater than the first reference potential;

a third line having a potential value switchable between said second reference potential in a first operation mode and a third reference potential greater than said second reference potential, in a second operation mode;

an input receiving an input signal which switches between a first logic state corresponding to said first reference potential and a second logic state corresponding to said second reference potential;

an output supplying an output signal which switches between a first logic state corresponding to said first reference potential and a second logic state corresponding to said potential value;

a switch defining a first and a second node connected respectively to said input and to said output; and a pull-up transistor interposed between said third line and said second node and having a control terminal receiving a control signal, the pull-up transistor configured to turn on in said second operation mode and in the presence of said second logic state of said input signal;

wherein said switch comprises a first and a second transistor, complementary to each other, having respective first terminals coupled together and connected to said first node, respective second terminals coupled together and connected to said second node and respective control terminals connected to said second line and, respectively, to said first line in said first operation mode and to said third line in said second operation mode.

2. The device according to claim 1 wherein said first transistor is an NMOS transistor and that said second transistor and said pull-up transistor are PMOS transistors.

3. The device according to claim 1, further comprising:

a fourth line connected to said control terminal of said second transistor; and a switching element for connecting said fourth line to said first line in a first switching position corresponding to said first operation mode and to said third line in a second switching position corresponding to said second operation mode.

4. The device according to claim 1 wherein said control terminal of said pull-up transistor is connected to said second line.

5. The device according to claim 1 wherein said control terminal of said pull-up transistor is connected to said output and that said device comprises an inverter interposed between said second node of said switch and said output, said inverter being connected to said third line.

6. The device according to claim 1 wherein said pull-up transistor has a resistance much greater than said first transistor.

7. A voltage level shifter device, comprising:

a first switch circuit having a first and a second input line and an output, the output having a first potential when the first switch circuit electrically connects the output to the first input line and the output having a second potential when the first switch circuit electrically connects the output to the second input line, the second potential being higher than the first potential; and a second switch circuit having a signal input, a potential input, and a signal output, the potential input being coupled to the output of the first switch circuit, the signal output being substantially at the first potential when the signal input has the first potential; the signal output being substantially at the second potential when the output of the first switch circuit has the second potential and the signal input has a third potential, which is between the first and second potential and the signal output being substantially at the third potential when the output of the first switch circuit has the first potential value and the signal input has the third potential value.

8. The device of claim 7, wherein the second switch circuit includes:

an pull-up circuit coupled to the second input line and to the signal output of the second switch circuit; and an electronic switch having a first and a second node, the first node being coupled to the signal input of the second switch circuit for receiving an input signal switching between the first and the third potential, the second node being coupled to the pull-up circuit and the signal output.

9. The device of claim 8 wherein the electronic switch comprises a first and a second transistor, complementary to each other, having respective first terminals coupled together and to the first node, respective second terminals coupled together and to the second node, and respective control terminals coupled to the output of the first switch circuit and, respectively, to a third input line having the third potential.

10. The device of claim 9 wherein the first transistor includes a PMOS transistor and the second transistor includes an NMOS transistor, said PMOS and NMOS transistors having their respective first terminals coupled together and to the first node and their respective second terminals coupled together and to the second node, said PMOS transistor having a gate terminal coupled to the output of the first switch circuit and said NMOS transistor having a gate terminal coupled to the third input line.

11. The device of claim 9 wherein pull-up circuit having a resistance much greater than that of the second transistor of the electronic switch.

12. The device of claim 8, wherein the pull-up circuit includes PMOS pull-up transistor having a source terminal coupled to the second input line and a drain terminal coupled to the second node.

13. The device of claim 12, wherein the PMOS pull-up transistor further includes a gate terminal coupled to the third input line, said pull-up transistor having the drain terminal coupled to the signal output of the second switch circuit.

14. The device of claim 12, further comprising an inverter circuit coupled between the drain terminal of the pull-up transistor and the signal output, said pull-up transistor having a gate terminal coupled to the signal output.

15. The device of claim 7, further comprising an inverter circuit coupled between the second switch circuit and the signal output.

16. A method of shifting voltage levels of a voltage level shifting circuit having an electronic switch circuit, the method comprising:

selecting with a control input, a signal input, and an output, a first or a second operation mode for the voltage level shifting circuit;

providing a first potential to the control input during the first operation mode and a second potential to the control input during the second operation mode;

receiving an input signal having the first potential, a third potential, the third potential having a value between the first and second potentials;

generating at the output an output signal having a same potential level as the input signal during the first operation mode, and the second potential when the input signal has the third potential during the second operation mode.

* * * * *